(12) United States Patent
Nishioka et al.

(10) Patent No.: US 6,447,842 B1
(45) Date of Patent: Sep. 10, 2002

(54) PROCESS FOR PRODUCING A CORROSION-RESISTANT MEMBER

(75) Inventors: Masao Nishioka, Tokoname; Keiichiro Watanabe, Kasugai, both of (JP)

(73) Assignee: NGK Insulators, Ltd. (JP)

( * ) Notice: Subject to any disclaimer, the term of this patent is extended or adjusted under 35 U.S.C. 154(b) by 0 days.

(21) Appl. No.: 09/609,539

(22) Filed: Jun. 30, 2000

Related U.S. Application Data

(62) Division of application No. 09/172,607, filed on Oct. 15, 1998, now Pat. No. 6,117,573.

(30) Foreign Application Priority Data

Oct. 27, 1997 (JP) .............................................. 9-294211

(51) Int. Cl.[7] .............................................. C23C 16/32
(52) U.S. Cl. ............................ 427/249.15; 427/249.16; 427/376.1
(58) Field of Search ...................... 427/249.15, 249.16, 427/372.2, 376.1

(56) References Cited

U.S. PATENT DOCUMENTS

| | | |
|---|---|---|
| 4,623,425 A | 11/1986 | Suzuki et al. |
| 4,623,517 A | 11/1986 | Biolik et al. |
| 4,788,018 A | 11/1988 | Yamada et al. |
| 5,229,193 A | 7/1993 | Madono et al. |
| 5,296,258 A * | 3/1994 | Tay et al. ................. 427/397.7 |
| 5,422,140 A * | 6/1995 | Collin .................... 427/249.15 |
| 5,677,060 A * | 10/1997 | Terentieva et al. ........ 427/397.7 |
| 5,683,824 A * | 11/1997 | Kobayashi et al. .......... 428/698 |
| 5,853,840 A | 12/1998 | Saito et al. |
| 5,861,346 A * | 1/1999 | Hamza et al. .......... 427/249.15 |
| 5,904,778 A * | 5/1999 | Lu et al. .................. 118/723 R |
| 6,042,900 A * | 3/2000 | Rakhimov et al. ...... 427/249.11 |

FOREIGN PATENT DOCUMENTS

| | | |
|---|---|---|
| DE | 35 30 551 C1 | 8/1986 |
| DE | 44 41 132 A1 | 5/1996 |
| JP | 5117227 | 5/1993 |
| JP | 8073288 | 3/1996 |

OTHER PUBLICATIONS

"Chemical Vapor Deposition of Silicon Carbide for Large Area Mirrors"; R.L. Gentilman et al.; Reflecting Optics for Synchronton Radiation; Upton, New York; Nov. 16–18, 1981; vol. 315, pp. 131–134, XP002100557 ISSN 0277–786X; Proceedings of the SPIE–The International Society for Optical Engineering, 1981 *p. 133; figures 2, 4; table 2*.

Patent Abstracts of Japan; vol. 009, No. 049 (E–300); Mar. 2, 1985 & JP 59 189622 A (Toshiba Ceramics KK), Oct. 27, 1984 *abstract*.

* cited by examiner

*Primary Examiner*—Bret Chen
(74) *Attorney, Agent, or Firm*—Parkhurst & Wendel, LLP

(57) ABSTRACT

A corrosion-resistant member includes a substrate made of a ceramic material and having a diameter of at least 200 mm, and a film of chemically vapor deposited silicon carbide having a thickness of not less than 0.5 mm and covering at least such a portion of the surface of the substrate that is to contact a corrosive material. A process is disclosed for producing such a corrosion-resistant member, which process includes thermally treating the film at a temperature higher, by not less than 50° C. centigrade, than a film-forming temperature at which the film of silicon carbide is formed, after the formation of the silicon carbide film.

4 Claims, 6 Drawing Sheets

FIG_1a
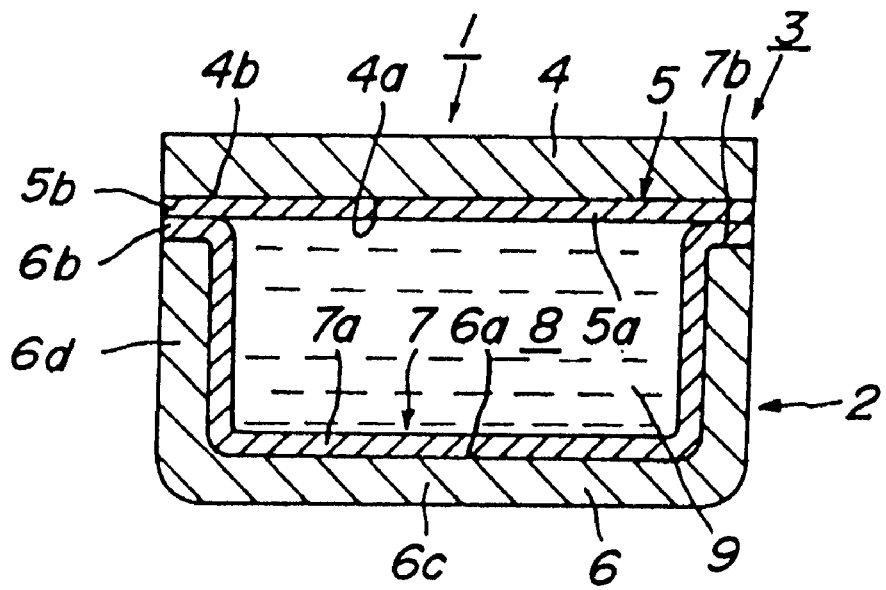
FIG_1b
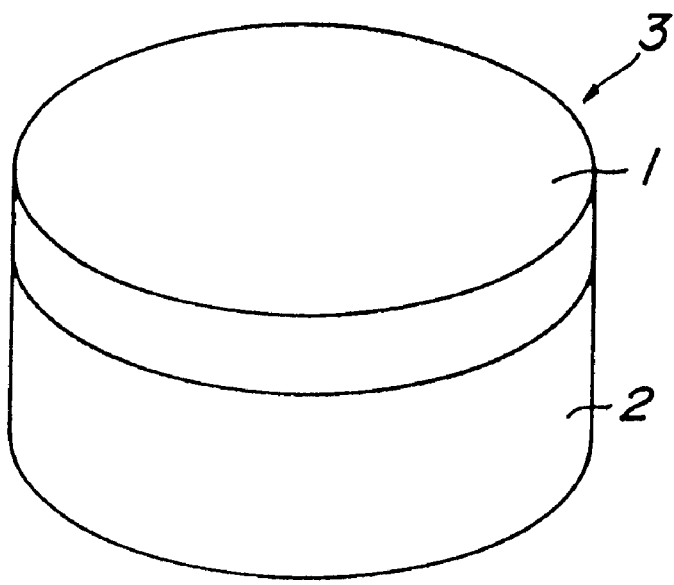

FIG._4a
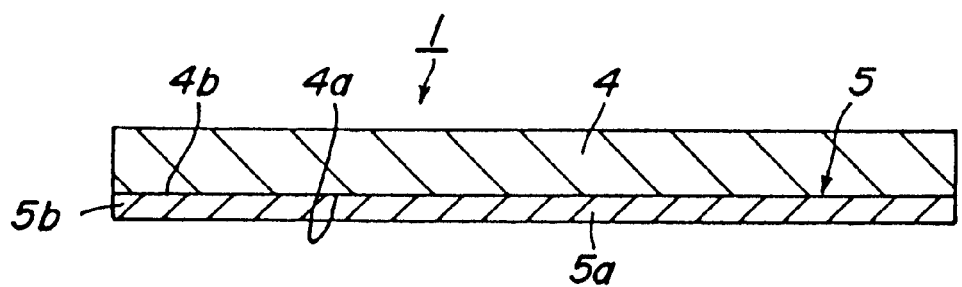
FIG._4b
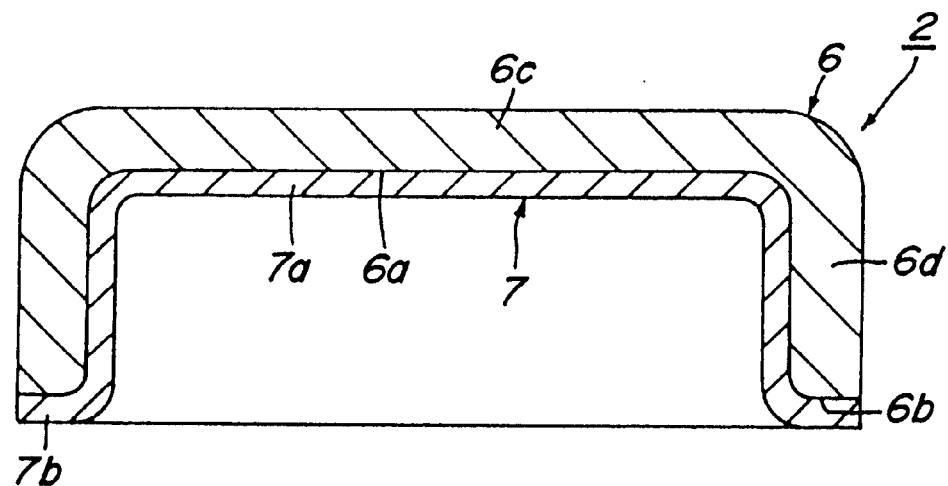
FIG._4c
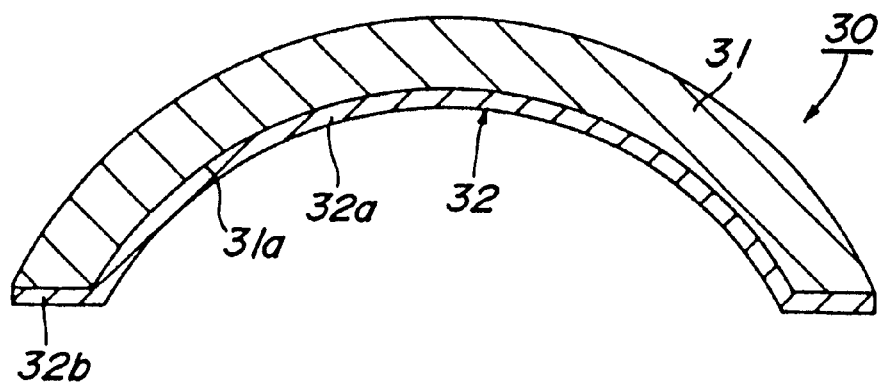

PROCESS FOR PRODUCING A CORROSION-RESISTANT MEMBER

This is a division of application Ser. No. 09/172,607, filed Oct. 15, 1998, now U.S. Pat. No. 6,117,573.

BACKGROUND OF THE INVENTION (1) Field of the Invention

The present invention relates to corrosion-resistant members and a producing process thereof.

(2) Related Art Statement

It is currently known that dense silicon carbide films are effective as liners in gas turbine parts and diesel engine parts, etc., and as antioxidant surface films for ceramic parts to be used in a high temperature atmosphere, etc. It is also known that surfaces of ceramic parts are covered with thin films of dense silicon carbide in some cases of semiconductor-producing apparatuses, etc. In order to form such thin films, the chemical gas phase growth method, the electrochemical gas phase growth method, the sputtering method, the spraying method, etc. are known. For example, since the gas phase method can form a high purity, dense and thin film having good properties, this method is frequently used.

Recently, it is demanded that not only super pure water and sterilized water but also hydrofluoric acid, nitric acid, hydrochloric acid, super high purity solutions containing mixed acids containing aqua regia or the like be treated, completely free from contamination with metallic ions or an organic material. There are demands for gas-tight parts to be exposed to reactive plasma gases such as $CF_4$, $NF_3$, $ClF_3$, HF, HCl, Hbr or the like. Such reactive plasmas are all highly corrosive. Members which can maintain gas-tightness and contamination resistance for an extended time period under the environment in which the members are exposed to the above solution or gas having highly corrosive property having been demanded.

SUMMARY OF THE INVENTION

Although the inventors had made investigations to solve the above problem, they encountered difficulties. That is, in order that gastight parts may be used, for instance, for semiconductor-producing apparatuses for a long time period, a film of silicon carbide is required to be made thicker. On the other hand, a large volume of a vessel is required to treat a large amount of the solution or gas. In order to enable the vessel having such a large volume to treat a large amount of the solution or gas, it is necessary to cover a large-area surface of a sintered body with a gas-tight film of silicon carbide.

However, although such gas-tight parts are actually subjected to heat impact between room temperature and high temperatures, the heat impact causes the film of silicon carbide to be cracked and reduce the gas tightness thereof, if the silicon carbide film is enlarged in area and thickened. Consequently, impurities contained in the substrate dissolved into the solution or gas, which unfavorably causes pollution.

It is an object of the present invention to provide a corrosion-resistant member comprising a substrate made of a ceramic material and a thick film of silicon carbide formed on a surface of the substrate by chemical vapor deposition, covering this surface, whereby the corrosion-resistant member has high corrosion resistance, and is free from cracking of the film of silicon carbide even upon application of heat impact.

It is another object of the present invention to produce such a corrosion-resistant member.

The corrosion-resistant member according to the present invention is characterized by comprising a substrate made of a ceramic material and having a diameter of at least 200 mm, and a film of chemically vapor deposited silicon carbide having a thickness of not less than 0.5 mm and covering at least such a portion of the surface of the substrate that is to contact a corrosive material.

The process for producing the above corrosion-resistant member according to the present invention is characterized in that the step of forming the film of silicon carbide at a film-forming temperature by the chemical vapor deposition is followed by a step of thermally heating the film of the silicon carbide at a temperature higher than the film-forming temperature by not less than 50° C. centigrade.

The film forming temperature is preferably not less than 1,400° C. centigrade and not more than 1,500° C. centigrade.

These and other objects, features and advantages of the invention will be well appreciated upon reading the following description of the invention when taken in connection with the attached drawings, with the understanding that some modifications, variations and changes may be easily made by the skilled person in the art within the purview of the invention.

BRIEF DESCRIPTION OF THE DRAWINGS

For a better understanding of the invention, reference is made to the attached drawings, wherein:

FIGS. 1a and 1b are a sectional view and a perspective view for outlining a vessel 3 made of a corrosive-resistant material, respectively;

FIGS. 4a, 4b and 4c are sectional views of corrosion-resistant members, respectively, by way of example;

DETAILED DESCRIPTION OF THE INVENTION

Figure 2:
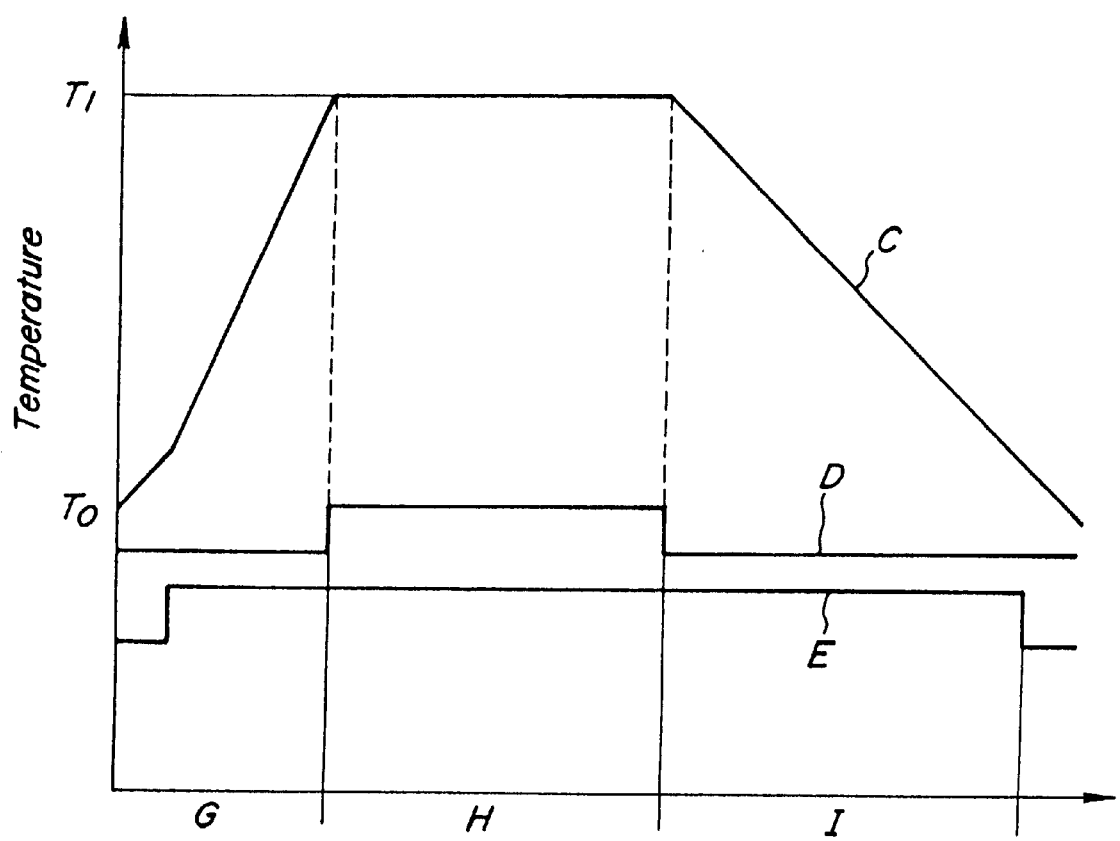
FIG. 2 is a graph showing a treating schedule in a chemical vapor deposition method carried out by the present inventors.

The present inventors formed films on sintered bodies of silicon carbide having various configurations by the chemical vapor deposition, and investigated their durability. As a result, the inventors came to have the following knowledge.

By way of example, the present inventors prepared a corrosion-resistant vessel 3 shown in FIGS. 1(a) and (b). This vessel 3 includes a lid 1 and a discoidal lower vessel body 2. The lid 1 includes a substrate 4 and a film 5 of silicon carbide covering an inner surface 4a and its peripheral surface 4b of the substrate 4 of the lid 1. An inner surface 6a and its edge surface 6b of a substrate 6 of the lower vessel body 2 are covered with a film 7 of silicon carbide. A corrosive material 9 is placed inside an inner space 8 of the vessel 3. Accordingly, a film 5a, 7a of silicon carbide is formed entirely on that surface portion of each of the substrates 4 and 6 which is to contact the corrosive material 9 inside the vessel, so that the corrosive material will not directly contact the corrosive material. Although the diameter of the vessel is not limited to any particular value, the diameter may be set at 300 mm or 500 mm, and the depth of the lower vessel body may be 100 mm.

The silicon carbide films 5b and 6b contact and rub each other at a fitting portion between the lid 1 and the lower vessel body 2 so that gas-tightness may be maintained at this fitting portion. The lid 1 and the lower vessel body 2 are pressed to each other by a clamp from outside, thereby constituting the gas-tight vessel.

The film of silicon carbide was formed on each of the substrates 4 and 6 by the chemical vapor deposition method. As reactive gases, carbon tetrachloride and methane were used. FIG. 2 illustratively shows a typical schedule in which a line C is a temperature schedule, a line D shows a feeding state of the reactive gases, and a line E a feeding state of a carrier gas.

The temperature was raised from a starting temperature To, e.g., room temperature to the maximum temperature $T_1$ in the chemical vapor deposition (Heating step G). During the heating, the carrier gas was fed. Then, while the temperature was maintained at the maximum temperature $T_1$ the substrate was heated, the carrier gas and the reactive gases were fed to effect the chemical vapor deposition (Chemical vapor deposition step H). At that time, a reaction: $SiCl_4 + CH_4 \rightarrow SiC + 4HCl$ occurred, so that silicon carbide was formed and heaped on a surface of the substrate, thereby forming a film of silicon carbide. Then, the substrate and the silicon carbide film were cooled (Cooling step I).

Figure 3:
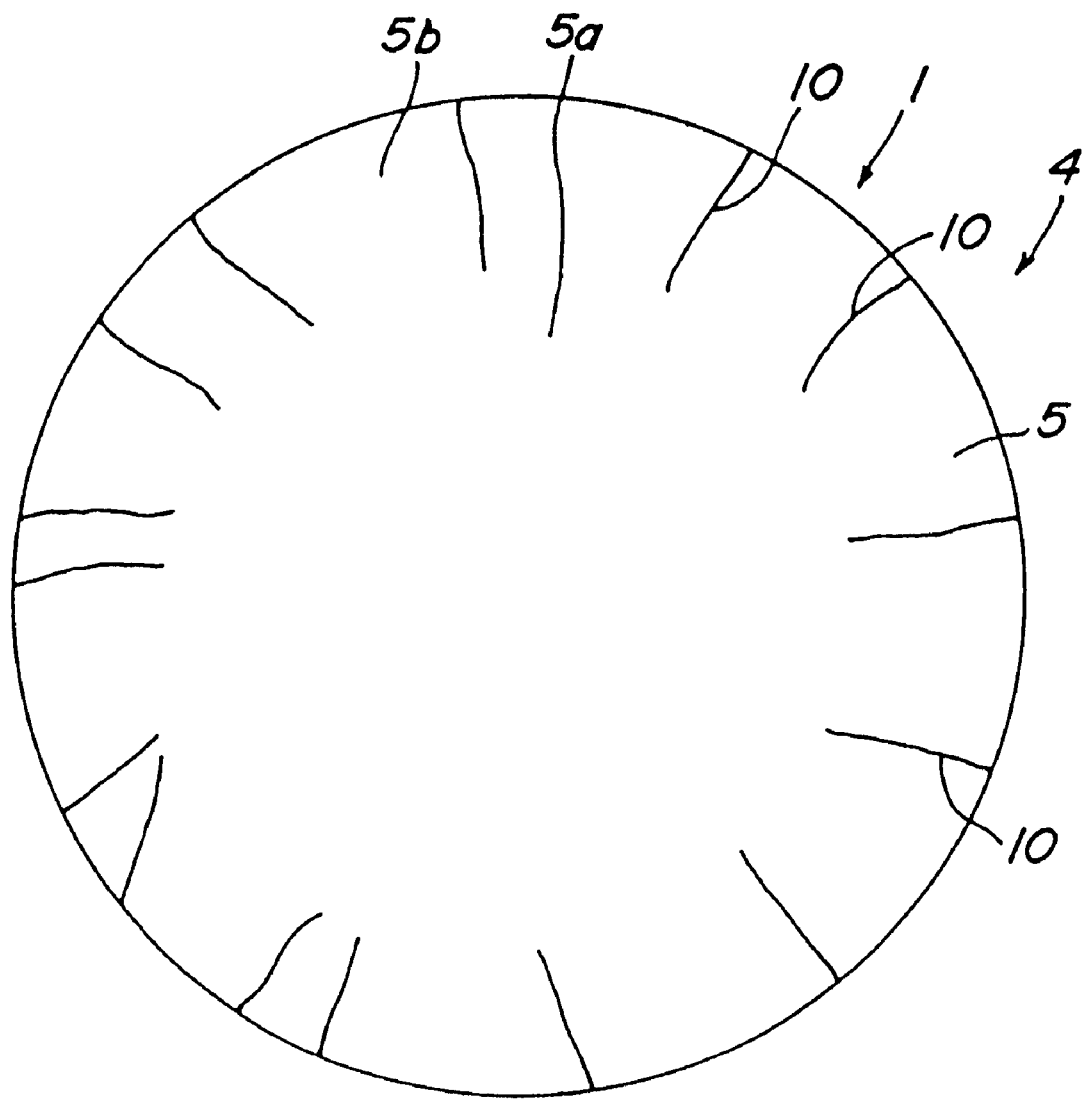
FIG. 3 is a plane view for illustrating the state in which a substrate is cracked.

It was discovered that if a larger substrate is used, a film of silicon carbide is likely to be cracked. This tendency was conspicuous particularly if a thicker film of silicon carbide is formed. FIG. 3 shows the cracking state at that time. The cracks 10 were radially formed from a peripheral edge portion 5b toward a central portion 5b of the film 5 on the substrate 4.

For example, it was found that when a discoidal sintered body was used as a substrate, no cracking occurred in the case that the width of the substrate was 50 mm, whereas cracking occurred in the case that it was 200 mm or more, and that the number of cracks further increased in the case that it was 300 mm or more. In particular, when the gas-tight member had a substrate in which at least such a portion of the surface contact a corrosive material, covered with a film of silicon carbide, a number of cracks were likely to be formed in the silicon carbide film during cooling the film, so that such a gas-tight member was difficult to be produced.

Although the present inventors investigated the reason why the large-size films of silicon carbide are likely to be cracked particularly if they are thick, they hardly found out its cause. For example, the inventors analyzed the X-ray diffraction of the films of silicon carbide, and investigated the distribution of the lattice constant of crystals constituting the films of silicon carbide. As a result, it was clarified that compression stress was applied to the film of silicon carbide in a planar direction. The skilled person in the art has been being considered that such a compression stress did not generally cause the film to be cracked different from tensile stress in a plane direction.

However, the present inventors discovered that the above cracking can be remarkably suppressed by thermally treating the film of silicon carbide at a temperature higher than the film-forming temperature by not less than 50° C. centigrade after the formation of the film of silicon carbide at the film-forming temperature by the chemical vapor deposition method. The present inventors reached their invention based on this discovery. The reason why such a remarkable function and effect are obtained has not be solved. The difference between the film-forming temperature and the thermally treating temperature is preferably not more than 200° C. centigrade.

By the above procedures, a corrosion-resistant member in which a film of chemically vapor deposit silicon carbide having the thickness of 0.5 mm or more, or 1 mm or more is coated upon a substrate made of a ceramic material having a diameter of not more than 200 mm. In addition, since a residual stress remaining in the silicon carbide film is conspicuously mitigated, such a corrosion-resistant member comes to withstand heat impact of heating and cooling, which could not be realized in conventional members having large-area films.

Although the configuration of the ceramic substrate is not particularly limited in the present invention, the substrate having at least a discoidal portion is particularly favorable. If the ceramic substrate has such a discoidal portion, the discoidal portion may have a discoidal shape or a variety of planar shapes. The thickness of the discoidal portion need not be constant. If the ceramic substrate has a discoidal portion, it is preferable that 80 to 100% of a main plane of the discoidal portion is covered with a film of silicon carbide.

If the ceramic substrate has a discoidal portion, it is preferable that the substrate has a peripheral wall portion provided at the main plane of the discoidal portion possessing a closed shape as viewed in a plane besides the discoidal portion. In this case, each of the inner wall surface of the peripheral wall portion and a tip end surface of the side wall portion is preferably covered with a film of silicon carbide. In such a case, the silicon carbide film formed at the tip end surface of the side wall portion can be used as a sealing portion for maintaining the gas-tightness in a corrosion-resistant material vessel as shown in FIG. 1.

FIGS. 4a to 4c are sectional views of ceramic substrates each having a discoidal portion. The corrosion-resistant members 1, 2 of FIGS. 4a and 4b are the same as those shown in FIGS. 1a and 1b. In FIG. 4(a), the entire main surface 4a and 4b of the substrate 4 is covered with the film 5 of silicon carbide. In FIG. 4(b), the substrate 6 includes a discoidal portion 6c and a peripheral wall portion 6d projecting from an edge of a main plane 6a of the discoidal portion 6c. The entire main plane 6a of the discoidal portion 6c, the inner wall surface of the peripheral wall portion 6d and the tip end surface 6b of the peripheral wall portion 6d are covered with a film of silicon carbide.

In the corrosion-resistant member 30 in FIG. 4c, a film 32a of silicon carbide is formed on the main plane 31a of the substrate 31 having a curved sectional shape, and a film 32b is formed on the tip end surface 31b of the substrate 32.

Since the corrosion-resistant member according to the present invention is large and withstands rapid heating/cooling, the corrosion-resistant member permits the heating/cooling rates of an etching solution for electronic parts to be largely increased and also enables treatment of a large number of the electronic parts at one time, if the corrosion resistant member is used, for example, in an electronic parts-producing apparatus. Consequently, the electronic parts-producing power per unit hour can be largely enhanced. Furthermore, since the corrosion-resistant chemically vapor deposited silicon carbide film is thick, the corrosion-resistant member can be used over a long time period.

In the present invention, cracking of the silicon carbide film can be strikingly suppressed during cooling by setting the thickness of silicon carbide at not less than 5 mm, particularly at not less than 10 mm. Although the thickness of the film of silicon carbide has no specific upper limit, it is practically preferable to set this thickness at not more than 20 mm. The purity of silicon carbide in the film is preferably 99.999% or more. The thickness of the substrate is preferably not less than 8 mm.

The film-forming temperature is preferably not less than 1400° C. centigrade and not more than 1500° C. centigrade. It is particularly preferable that the heat treatment is effected in argon gas at a temperature higher than the film-forming temperature by 50° C. centigrade for one hour or more. The heat treatment time is practically preferably not more than 5 hours.

In the above-mentioned corrosion-resistant vessel, since the silicon carbide films are completely dense bodies having high purity and the theoretical density and entirely cover the surfaces of the vessel which are to contact the corrosive material, the corrosive material does not contact the substrate containing much impurities. If the silicon carbide film is corroded with the corrosive solution or the reactive plasma gas, the solution ion gas is not contaminated with heavy metal ions, etc. Further, since the film is sufficiently thick, good characteristics of the vessel can be maintained over a prolonged time period.

The substrate is preferably a sintered body composed mainly of silicon carbide. The following are recited as the substrate by way of example.

(1) A ceramic sintered body having a composition percentage of silicon carbide being not less than 90% and a relative density of not less than 90%

(2) A porous ceramic sintered body having a composition percentage of silicon carbide being not less than 90% and a relative density of 56–90%

(3) A mixed sintered body of silicon carbide and silicon.

As the corrosive material, the above-mentioned corrosive solution is preferred. For example, the gas-tight vessel to be exposed to the reactive plasma gas is demanded for the semiconductor-producing apparatus or the like. As the reactive plasma gas, $CF_4$, $NF_3$, $ClF_3$, HF, HCl, and HBr recited, all of them having strong corrosive property. An article for heating such a highly corrosive gas in a gas-tight vessel has been demanded, and the corrosion-resistant member according to the present invention can be applied to such an article.

Figure 5:
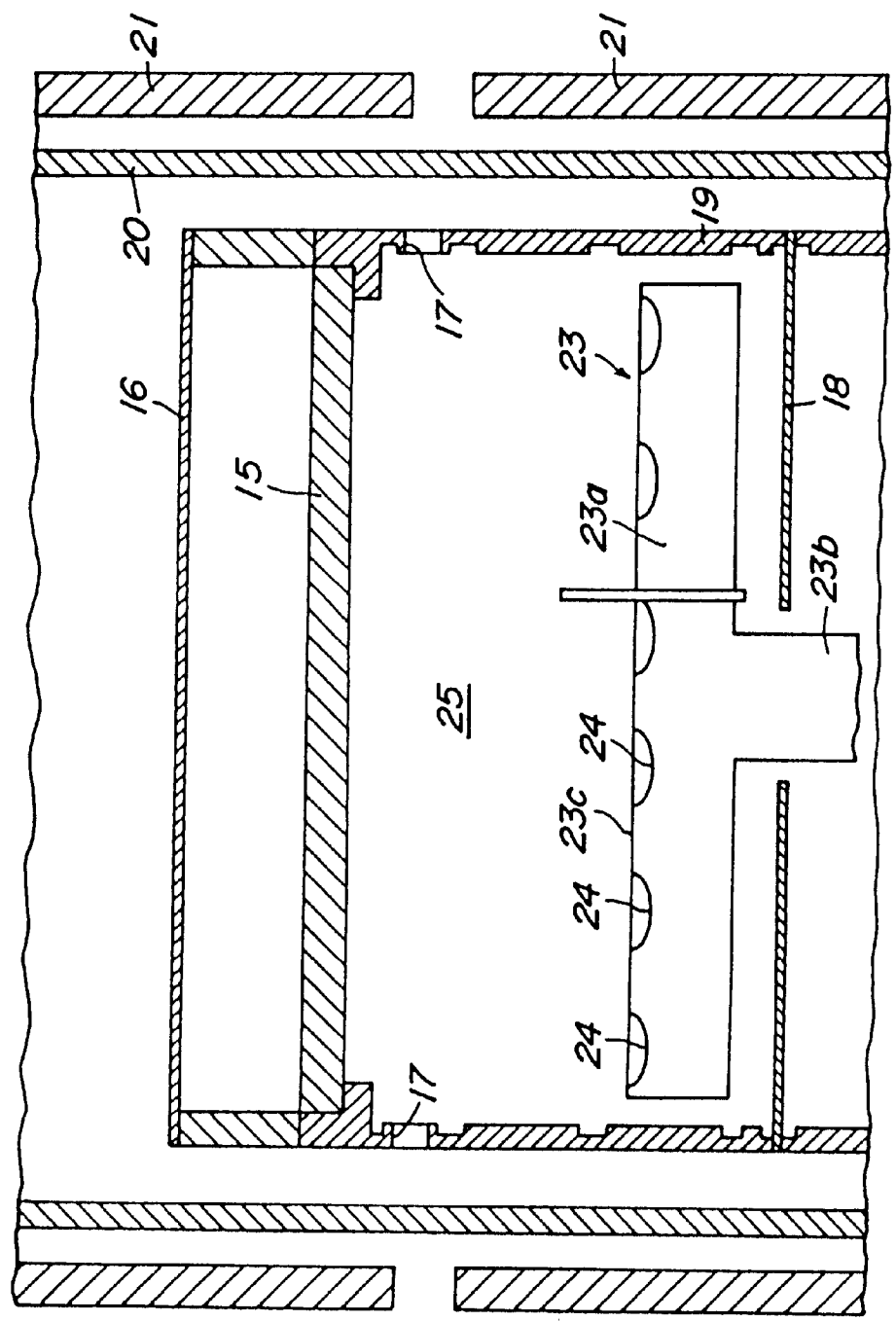
FIG. 5 is a sectional view for outlining a chemically vapor depositing apparatus suitable for carrying out the producing process of the present invention.

A more preferable embodiment according to the present invention will be explained below. A given substrate 15 is placed in a chemical vapor deposition (CVD) furnace schematically illustrated in FIG. 5. The substrate 15 is supported by a holding jig 19. Reference numerals 16, 18 are jigs. In this embodiment, a raw material feed pipe 23 having a T-letter front face shape is provided. The raw material feed pipe 23 has a laterally extending blow-out portion 23a and a base portion 23b extending therefrom. A given number of gas ejection openings 24 are provided at a surface side 23c opposed to a base portion of the blow-out portion 23a. Reference numerals 20 and 21 denote an inner cylinder and an exterior heater, respectively.

The distance between the surface 23c of the raw material feed pipe 23 and the substrate 15 is set at for example 100 to 300 mm. While the raw material feed pipe 23 is being rotated, the gas is ejected through the gas ejection openings 24. The CVD raw material gas is ejected through the gas ejection openings 24, flows in a space 25, impinges upon and flows along the surface of the substrate 15, and is discharged through exhaust holes 17 provided in the holding jig 19.

The thickness of a film of silicon carbide covering the entire surface of the substrate 15 can be made uniform by using the thus configured raw material feed pipe 23 and ejecting the gas under rotation of the raw material feed pipe 23.

Figure 6:
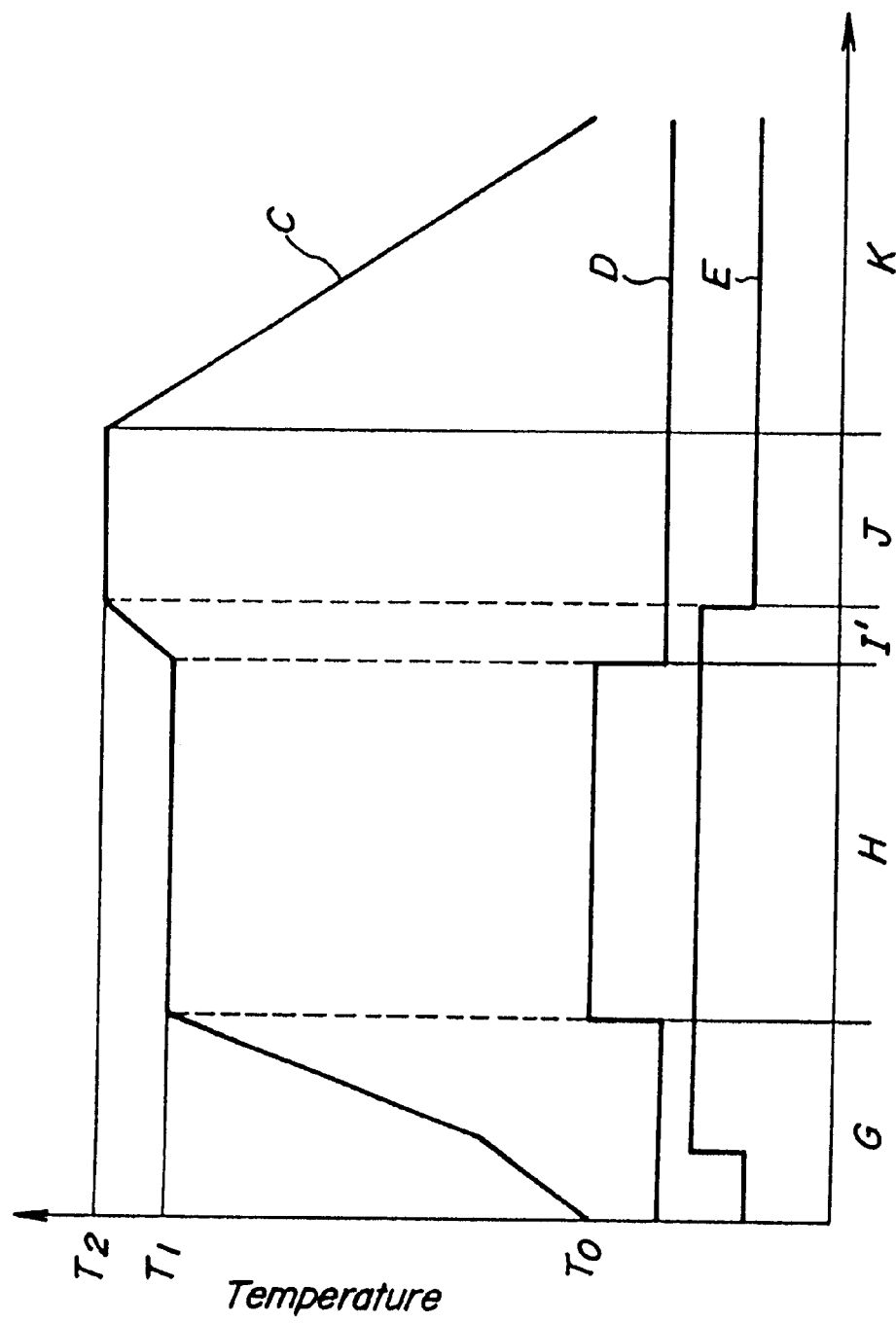
FIG. 6 is a graph showing a treating schedule according to one embodiment of the producing process of the present invention.

FIG. 6 shows a treating schedule in the chemical vapor deposition method in which a line C is a temperature schedule, and lines D and E show feeding states of a reactive gas and a carrier gas, respectively.

The temperature was raised from a starting temperature To, (e.g., room temperature) to the maximum temperature $T_1$ in the chemical vapor deposition (Heating step G). During the heating, the carrier gas was fed. Then, while the temperature was maintained at the maximum temperature $T_1$, the substrate was heated, the carrier gas and the reactive gases were fed to effect the chemical vapor deposition (Chemical vapor deposition step H).

Preferably, after hydrogen is continuously flown through the interior of the furnace at the film-forming temperature $T_1$ for a while, a silicon-source compound and a carbon-source compound are introduced into the furnace. By flowing hydrogen at the film-forming temperature is $T_1$ before the introduction of the silicon-source compound and the carbon-source compound, adhesion between the substrate and the silicon carbide film can be improved and peeling of the silicon carbide film can be prevented. More desirably, the adhesion between the substrate and the silicon carbide film can be further improved by feeding only the silicon-source compound into the furnace for a short time together with hydrogen and an inert gas before the introduction of the carbon-source compound.

At a point of time when the film-forming step H is terminated, the silicon-source compound and the carbon-source compound are stopped, whereas hydrogen and the inert gas (preferably, argon gas) only are flown as the carrier gas and the temperature inside the furnace is raised to $T_2$ higher than the film-forming temperature by 50° C. centigrade (I' step, heating step). Then, the carrier gas is stopped, and the film-deposited substrate is heated in the inert gas/hydrogen atmosphere for not less than 1 hour (J, heating step). Thereafter, the substrate and the silicon carbide film are cooled (K step).

As the silicon-source compound, $SiCl_4$, $SiHCl_3$, $SiCl_2H_2$, and $SiH_4$ are preferred, whereas $CH_4$, $C_2H_6$, and $C_3H_8$ are particularly preferred.

EXAMPLES (Experiment 1)

A corrosion-resistant members was produced according to the above-mentioned method under the schedule of FIG. 2 with use of the CVD apparatus. As the substrate 15, a discoidal substrates made of silicon carbide ceramic having the diameter of 50 mm and the thickness of 10 mm was used.

Argon gas was fed as a carrier gas during heating from room temperature. Then, the film-forming temperature was kept at 1430° C. centigrade. When the temperature reached 1430° C. centigrade, hydrogen was first preliminarily flown for 10 minutes, and then silicon tetrachloride and methane were introduced. The ratio among the flow amounts of silicon tetrachloride, methane, hydrogen and argon during the film formation were 13:10:44:19 as calculated in the standard state.

The thickness of the silicon carbide film was 0.5 mm in a central portion of the discoidal substrate. No crack was observed in the silicon carbide film obtained. Whether the film was cracked or not was confirmed by a fluorescent damage test.

(Experiment 2)

A corrosion-resistant members was produced according to the above-mentioned method under the schedule of FIG. 2 or 6 with use of the CVD apparatus. As the substrate 15, a discoidal substrates made of silicon carbide ceramic having the diameter of 280 mm and the thickness of 15 mm was used.

Argon gas was fed as a carrier gas during heating from room temperature. Then, the film-forming temperature was kept at 1430° C. centigrade. When the temperature reached 1430° C. centigrade, hydrogen was first preliminarily flown for 10 minutes, and then silicon tetrachloride and methane were introduced. The ratio among the flow amounts of silicon tetrachloride, methane, hydrogen and argon during the film formation were 13:10:44:19 as calculated in the standard state.

As shown in Table 1, the average film thicknesses of the silicon carbide films were varied by adjusting the film-forming time period. The holding time period at the film-forming temperature was 5 to 50 hours. Referring to Table 1, the schedule in FIG. 2 was employed in Comparative Examples 1–5, and the schedule of FIG. 6 was used in Comparative Example 6 and Examples 1–6. The number of cracks immediately after the production of the corrosion-resistant member and that after the heat impact test were measured, and results thereof are shown in Table 1. In the heat impact test, immediately after the corrosion-resistant member was produced, the member was heated at 180° C. centigrade in an electric furnace, immersed into water at room temperature, and allowed to be left for 20 minutes. With respect to each of Examples and Comparative Examples, the corrosion-resistant members were prepared.

TABLE 1

| Diameter of discoidal substrate: 280 mm | Average thickness of silicon carbide film (mm) | Difference between film-forming temperature and thermally-treating temperature (° C.) | Number of cracks After preparation | After heat impact test |
|---|---|---|---|---|
| Comparative Example 1 | 0.5 | not thermally treated | 1 ~ 5 | 4 ~ 12 |
| Comparative Example 2 | 1.1 | not thermally treated | 2 ~ 15 | 5 ~ 8 |
| Comparative Example 3 | 2.1 | not thermally treated | 15 | — |
| Comparative Example 4 | 4.2 | not thermally treated | 23 | — |
| Comparative Example 5 | 8.3 | not thermally treated | 28 | — |
| Comparative Example 6 | 2.1 | 30 | 0 ~ 3 | 3 ~ 10 |
| Example 1 | 2.1 | 50 | 0 | 0 |
| Example 2 | 2.1 | 70 | 0 | 0 |
| Example 3 | 4.2 | 50 | 0 | 0 |
| Example 4 | 4.2 | 70 | 0 | 0 |
| Example 5 | 8.3 | 50 | 0 | 0 |
| Example 6 | 8.3 | 70 | 0 | 0 |

In Comparative Examples 1–5, cracks were formed immediately after the production of the corrosion-resistant members, and the number of the cracks increased after the heat impact test. As the thickness of the silicon carbide film increased, the number of the cracks increased. In Example 6, some improvement was observed as compared with Comparative Example 3, but cracks occurred in almost all the corrosion-resistant members.

In Examples 1 to 6, no crack was observed at all, immediately after the production and after the heat impact test.

(Experiment 3)

Corrosion-resistant members in each of Comparative Examples and Examples were produced in the same manner as in Experiment 2, provided that the diameter and the thickness of the discoidal substrate were set at 500 mm and 20 mm, respectively.

TABLE 2

| Diameter of discoidal substrate: 500 mm | Average thickness of silicon carbide film (mm) | Difference between film-forming temperature and thermally-treating temperature (° C.) | Number of cracks After preparation | After heat impact test |
|---|---|---|---|---|
| Comparative Example 7 | 0.5 | not thermally treated | 6 ~ 18 | 10 ~ 21 |
| Comparative Example 8 | 1.1 | not thermally treated | 10 ~ 21 | 18 ~ 24 |
| Comparative Example 9 | 2.1 | not thermally treated | 19 | — |
| Comparative Example 10 | 4.2 | not thermally treated | 25 | — |
| Comparative Example 11 | 8.3 | not thermally treated | 34 (peeled) | — |
| Comparative Example 12 | 2.1 | 30 | 12 | |
| Example 7 | 2.1 | 50 | 0 | 0 |
| Example 8 | 2.1 | 70 | 0 | 0 |
| Example 9 | 4.2 | 50 | 0 | 0 |
| Example 10 | 4.2 | 70 | 0 | 0 |
| Example 11 | 8.3 | 50 | 0 | 0 |
| Example 12 | 8.3 | 70 | 0 | 0 |

In Comparative Examples 7–12, when the thickness of the silicon carbide film was not less than 0.5 mm, the film was cracked. particularly when the silicon carbide film was 8 mm in thickness, the film was cracked and sometimes peeled from the substrate (Comparative Example 11). To the contrary, in Examples 7 to 12 of the present invention, no crack occurred by setting the thermal treating temperature higher than the film-forming temperature by not less than 50° C. centigrade.

(Experiment 4)

Similarly to Experiment 2, corrosion-resistant members were produced in each of Examples and Comparative Examples in Table 3. The diameter and the thickness of the discoidal substrate were set at 500 mm and 20 mm, respectively. The film-forming temperature was set at 1480° C. centigrade.

TABLE 3

| Diameter of discoidal substrate: 500 mm | Average thickness of silicon carbide film (mm) | Difference between film-forming temperature and thermally-treating temperature (° C.) | Number of cracks After preparation | After heat impact test |
|---|---|---|---|---|
| Comparative Example 13 | 0.5 | not thermally treated | 6 ~ 19 | 10 ~ 23 |
| Comparative Example 14 | 1.1 | not thermally treated | 12 ~ 23 | 16 ~ 28 |
| Comparative Example 15 | 2.1 | not thermally treated | 17 | — |
| Comparative Example 16 | 4.2 | not thermally treated | 28 | — |
| Comparative Example 17 | 8.3 | not thermally treated | 38 (peeled) | — |

TABLE 3-continued

| Diameter of discoidal substrate: 500 mm | Average thickness of silicon carbide film (mm) | Difference between film-forming temperature and thermally-treating temperature (° C.) | Number of cracks After preparation | Number of cracks After heat impact test |
|---|---|---|---|---|
| Comparative Example 18 | 2.1 | 30 | 15 | |
| Example 13 | 2.1 | 50 | 0 | 0 |
| Example 14 | 2.1 | 70 | 0 | 0 |
| Example 15 | 4.2 | 50 | 0 | 0 |
| Example 16 | 4.2 | 70 | 0 | 0 |
| Example 17 | 8.3 | 50 | 0 | 0 |
| Example 18 | 8.3 | 50 | 0 | 0 |

In Comparative Examples 13–18, when the thickness of the silicon carbide film was not less than 0.5 mm, the film was cracked. Particularly when the silicon carbide film was 8 mm in thickness, the film was cracked and sometimes peeled from the substrate (Comparative Example 17). To the contrary, in Examples 13 to 18 of the present invention, no crack occurred by setting the thermal treating temperature higher than the film-forming temperature by not less than 50° C. centigrade.

As mentioned above, occurrence of the cracks can be diminished by effecting the thermal treatment at a temperature higher than the film-forming temperature by not less than 50° C. centigrade after the formation of the film, irrespective of the film-forming temperature.

As mentioned above, according to the present invention, since the corrosion-resistant member has the construction that the substrate made of a ceramic material and having the diameter of at least 200 mm, and that the film of chemically vapor deposited silicon carbide having the thickness of not less than 0.5 mm and covering at least such a portion of the surface of the substrate that is to contact a corrosive material, the corrosion-resistant member has high corrosion-resistance and free from cracking of the silicon carbide film even upon application of heat impact.

What is claimed is:

1. A process for producing a corrosion-resistant member comprising the steps of preparing a substrate made of a ceramic material and having a diameter of at least 200 mm, forming a film of silicon carbide on the substrate by chemical vapor deposition, said film having a thickness of not less than 0.5 mm and covering at least such a portion of a surface of the substrate that is to contact a corrosive material, and then without cooling thermally treating the film in an inert atmosphere at a temperature higher, by not less than 50° C. centigrade, than a film-forming temperature at which the film of silicon carbide is formed whereby any residual stress in the silicon carbide film formed by chemical vapor deposition is mitigated, thereby suppressing cracks from forming in the silicon carbide film.

2. The producing process set forth in claim 1, wherein the film forming temperature is not less than 1,400° C. centigrade and not more than 1,500° C. centigrade.

3. The producing process set forth in claim 1, wherein the thermally treating temperature is higher than the film-forming temperature by not more than 200° C. centigrade.

4. The producing process set forth in claim 1, wherein the film of silicon carbide is formed by a reaction between a silicon-source compound selected from the group consisting of $SiCl_4$, $SiHCl_3$, $SiCl_2H_2$, and $SiH_4$, and a carbon-source compound selected from the group consisting of $CH_4$, $C_2H_6$, and $C_3H_8$.

* * * * *